(12) United States Patent
Bardin (10) Patent No.: US 12,155,363 B2
(45) Date of Patent: Nov. 26, 2024

(54) CIRCUIT DEVICE INCLUDING AN IMPEDANCE MATCHING NETWORK HAVING AT LEAST ONE INDUCTOR FORMED BY A FILM OF SUPERCONDUCTOR MATERIAL EXHIBITING KINETIC SHEET INDUCTANCE

(71) Applicant: Google LLC, Mountain View, CA (US)

(72) Inventor: Joseph Cheney Bardin, Amherst, MA (US)

(73) Assignee: Google LLC, Mountain View, CA (US)

( * ) Notice: Subject to any disclaimer, the term of this patent is extended or adjusted under 35 U.S.C. 154(b) by 551 days.

(21) Appl. No.: 17/381,174

(22) Filed: Jul. 20, 2021

(65) Prior Publication Data

US 2022/0029589 A1    Jan. 27, 2022

Related U.S. Application Data

(60) Provisional application No. 63/054,277, filed on Jul. 21, 2020.

(51) Int. Cl.
*H03H 7/38* (2006.01)
*G06N 10/00* (2022.01)
*H03F 1/30* (2006.01)
*H03F 1/56* (2006.01)
*H03F 19/00* (2006.01)

(52) U.S. Cl.
CPC ............... *H03H 7/38* (2013.01); *G06N 10/00* (2019.01); *H03F 1/30* (2013.01); *H03F 1/565* (2013.01); *H03F 19/00* (2013.01); *H03F 2200/222* (2013.01)

(58) Field of Classification Search
CPC ........ H01P 1/2032; H01P 5/028; H03F 19/00; H03H 7/02
USPC ....................... 333/33, 219.1, 99 S
See application file for complete search history.

(56) References Cited

U.S. PATENT DOCUMENTS

| | | |
|---|---|---|
| 9,520,180 B1 | 12/2016 | Mukhanov et al. |
| 2003/0224944 A1 | 12/2003 | Ichev et al. |
| 2015/0235933 A1 | 8/2015 | Ladhani et al. |
| 2018/0232653 A1* | 8/2018 | Selvanayagam et al. ............. H01P 5/028 |
| 2019/0131944 A1* | 5/2019 | Naaman et al. ........ H03F 1/565 |

OTHER PUBLICATIONS

International Preliminary Report on Patentability in International Appln. No. PCT/US2021/042390, mailed on Feb. 2, 2023, 11 pages.

(Continued)

*Primary Examiner* — Benny T Lee
(74) *Attorney, Agent, or Firm* — Fish & Richardson P.C.

(57) ABSTRACT

A circuit device includes a semiconductor device and an impedance matching network. The impedance matching network includes a superconductor material forming at least one inductor of the circuit device, and the superconductor material exhibits a kinetic inductance per unit square when in a superconducting state. The impedance matching network is configured to transform an impedance of the semiconductor device to match a predetermined second impedance during operation of the circuit device.

34 Claims, 7 Drawing Sheets

(56) References Cited

OTHER PUBLICATIONS

Chang et al., "A wideband cryogenic SiGe LNA MMIC with an average noise temperature of 2.8 K from 0.3-3 GHz," 2017 IEEE International Microwave Symposium, Jun. 2017, pp. 157-159.
International Search Report and Written Opinion in International Appln. No. PCT/US2021/042390, dated Nov. 16, 2021, 19 pages.
Irwin et al., "Microwave SQUID multiplexer," Applied Physics Letters, Sep. 2004, 85(11):2107-2109.
Santavicca et al., "Microwave dynamics of high aspect ratio superconducting nanowires studied using self-resonance," Journal of Applied Physics, Jun. 2016, 119(234302):8 pages.
Office Action in Australian Appln. No. 2021312806, mailed on Aug. 21, 2023, 3 pages.
Annunziata et al., "Tunable superconducting nanoinductors," Nanotechnology, Oct. 2010, 21(44):445202.
Bardin, "Silicon-Germanium Heterojunction Bipolar Transistors For Extremely Low-Noise Applications," Thesis for the degree of Doctor of Philosophy, California Institute of Technology, Pasadena, California, May 21, 2009, 234 pages.
Berggren et al., "A superconducting nanowire can be modeled by using SPICE," Supercond. Sci. Technol., Apr. 2018, 31(5):055010.
Clem et al., "Kinetic impedance and depairing in thin and narrow superconducting films," Physical Review B, Nov. 2012, 86:174521.
Lakeshore.com [online], "Model CRX-4K Cryogenic Probe Station," 2019, retrieved on Jul. 21, 2021, retrieved from URL<https://www.lakeshore.com/products/categories/overview/material-characterization-products/cryogenic-probe-stations/model-crx-4k-cryogenic-probe-station/>, 3 pages.
Lownoisefactory.com [online], "LNF-LNC4_8C 4-8 GHz Cryogenic Low Noise Amplifier," Sep. 2018, retrieved on Jul. 21, 2021, retrieved from URL<www.lownoisefactory.com>, 6 pages.
Lpkf.com [online], "LPKF ProtoLaser U4," Sep. 2020, retrieved on Jul. 21, 2021, retrieved from URL<https://www.lpkf.com/en/industries-technologies/research-in-house-pcb-prototyping/produkte/lpkf-protolaser-u4/>, 14 pages.
Montazeri et al., "A sub-milliwatt 4-8 GHz SiGe cryogenic low noise amplifier," 2017 IEEE MTT-S International Microwave Symposium, Jun. 2017, 160-163.
Montazeri et al., "Ultra-Low-Power Cryogenic SiGe Low-Noise Amplifiers: Theory and Demonstration," IEEE Transactions on Microwave Theory and Techniques, Nov. 2015, 64(1):178-187.
Notice of Allowance in Australian Appln. No. 2021312806, mailed on Apr. 3, 2024, 3 pages.

\* cited by examiner

CIRCUIT DEVICE INCLUDING AN IMPEDANCE MATCHING NETWORK HAVING AT LEAST ONE INDUCTOR FORMED BY A FILM OF SUPERCONDUCTOR MATERIAL EXHIBITING KINETIC SHEET INDUCTANCE

CROSS-REFERENCE TO RELATED APPLICATIONS

This application claims priority to U.S. Provisional Application Ser. No. 63/054,277, filed on Jul. 21, 2020. The disclosure of the prior application is considered part of and is incorporated by reference in the disclosure of this application.

BACKGROUND

Cryogenic circuits may be used to process signals in various applications, including quantum computing. Particular designs of the cryogenic circuits may increase their signal-processing fidelity or decrease power consumption.

SUMMARY

The present disclosure relates to circuit devices including a semiconductor device and a kinetic inductor.

In one aspect, the present disclosure describes a circuit device that includes a semiconductor device and an impedance matching network, in which the impedance matching network includes a superconductor material forming at least one inductor of the circuit device, in which the superconductor material exhibits a kinetic inductance per unit square when in a superconducting state, and in which the impedance matching network is configured to transform an impedance of the semiconductor device to match a predetermined second impedance during operation of the circuit device. In some implementations, the circuit device is an amplifier.

The foregoing and other implementations may include one or more of the following. The semiconductor device is a semiconductor transistor. The transformed impedance of the semiconductor device is an output impedance of the semiconductor transistor. The circuit device includes a second semiconductor transistor, and the predetermined second impedance is an input impedance of the second semiconductor transistor. The semiconductor transistor is a heterojunction bipolar transistor or a field-effect transistor.

In various implementations, the predetermined second impedance is an impedance that reduces a noise of the circuit device. The predetermined second impedance is an impedance of an electrical element coupled to the circuit device. The electrical element includes a coaxial cable. The predetermined second impedance is about 50 Ohms.

The foregoing and other implementations may include one or more of the following. The semiconductor device and the at least one inductor are formed as part of an integrated circuit integrated in a single chip. The single chip includes a plurality of metal layers buried at respective heights in a dielectric material, at least a first of the metal layers including a contact trace coupled to the semiconductor device, at least a second of the metal layers including the superconductor material. The single chip includes a first layer above the superconductor material and a second layer below the superconductor material, in which the first layer and the second layer include an opaque material. The first layer and the second layer include a second superconductor material. The matching network includes a capacitor coupled to the at least one inductor. The semiconductor device is a semiconductor transistor, and the capacitor is coupled to a base of the semiconductor transistor.

In various implementations, the kinetic inductance per square is between about 1 pH and about 200 pH for microwave signals. The kinetic inductance per square is between about 1 pH and about 200 pH for microwave signals when currents passing through the at least one inductor have a magnitude of less than about 5% of a depairing current of the superconductor material. The kinetic inductance per square is between about 1 pH and about 200 pH for microwave signals when the superconductor material is at a temperature between 0 K and about half a critical temperature of the superconductor material. A total kinetic inductance of the at least one inductor is between about 1 nH and about 100 nH for microwave signals. The at least one inductor has a dimension between about 1 μm and about 50 μm. The at least one inductor includes a thin film of the superconductor material having a meandering shape, the meandering shape having between two and fifty meanders. The circuit device is coupled to a qubit.

In one aspect of another embodiment of the present disclosure, a cryogenic amplifier circuit is described. The cryogenic amplifier circuit includes a plurality of semiconductor transistors and an impedance matching network coupled to a first semiconductor transistor of the plurality of semiconductor transistors, the impedance matching network including at least one kinetic inductor including a superconductor material, in which the superconductor material exhibits a kinetic inductance per unit square when in a superconducting state, and in which an impedance of the cryogenic amplifier circuit matches a predetermined second impedance. In some implementations, the impedance matching network includes a capacitor coupled to the at least one kinetic inductor and to a base of the first semiconductor transistor, and the cryogenic amplifier circuit includes an LC network or RLC network coupled to a collector of the first semiconductor transistor, and a ground node coupled to an emitter of the first semiconductor transistor.

Particular embodiments of the subject matter described in this specification can be implemented to realize one or more of the following advantages. In some implementations, power dissipation in a circuit device may be reduced. In some implementations, signal noise in a circuit device may be reduced. In some implementations, transistor size may be reduced. In some implementations, light absorption by superconducting components may be reduced. In some implementations, higher impedance transformations may be performed. In some implementations, constant inductivity characteristics of a kinetic inductor may be maintained. In some implementations, noise in a circuit device may be reduced.

The details of one or more implementations are set forth in the accompanying drawings and the description below. Other features and advantages will be apparent from the description and drawings, and from the claims.

DETAILED DESCRIPTION

The present disclosure relates generally to the field of circuit devices including superconductors. In a particular example, this disclosure relates to circuit devices including a semiconductor device and an impedance-matching network including a superconducting kinetic inductor.

Cryogenic circuits have found applications in quantum computing. In particular, cryogenic amplifiers may be used to amplify signals to or from quantum circuits, for example, in order to read out qubit states.

However, in some cases, existing cryogenic amplifiers exhibit high power consumption. For example, existing cryogenic amplifiers may dissipate about 5 mW to 10 mW of DC power. When power is dissipated in a cryogenic circuit, the temperature of the cryogenic circuit or of adjacent components may be increased, causing negative effects that may include increases in noise and/or a loss of superconductivity. In order to maintain low temperatures, power dissipated in a low-temperature device must be removed from the cooled system; however, there may be limits to how much power can be dissipated. Therefore, it may be desirable to design cryogenic low-noise amplifiers (LNAs) that dissipate significantly less power.

In general (for example, as seen in the development of classical circuit components), one way of reducing power consumption is to decrease the size of circuit components, e.g., semiconductor devices (e.g., transistors) included in cryogenic LNAs. However, signal processing characteristics of LNAs may change as component sizes are decreased. For example, as transistor size is scaled down, the capacitance of the transistor tends to decrease.

In particular, noise characteristics of LNAs may be modified. In general, the small-signal characteristics of an LNA modeled as a linear two-port amplifier are determined (at a fixed frequency) by a set of network parameters (four complex numbers, e.g., s-parameters) and four noise parameters. The specific form of the noise parameters can vary depending on the application.

The noise temperature $T_E$ of an LNA terminated in the complex impedance $Z_{GEN}$ can be expressed as $T_E = T_{MIN}[1 + T_{MIN})|Z_{GEN} - Z_{OPT}|^2 /(\text{Re}\{Z_{GEN}\}\text{Re}\{Z_{GEN}\})]$, where $T_{MIN}$ is the minimum achievable noise temperature, $Z_{OPT}$ is the generator impedance that minimizes the overall noise, $T_0$ is a reference temperature (e.g., 290 K), and N is a sensitivity factor. In some implementations, $NT_0/T_{MIN}$ may be between ¼ and ½.

Given this expression, noise can be minimized (i.e., set to the value $T_{MIN}$) by terminating the LNA (or, in various implementations, a stage of the LNA or a transistor included in the LNA) with $Z_{GEN}$ equal to $Z_{OPT}$. Components of the LNA may be designed to have a specific $Z_{OPT}$ that matches a desired $Z_{GEN}$ (e.g., a known impedance of a device coupled to the LNA). In practice, there may be other considerations as well. For example, it may be necessary to account for frequency dependencies of the network and noise parameters, or there may be possible tradeoffs between bandwidth and losses (e.g., reflective losses) in matching networks.

In some cases, it may be desirable to terminate the input-stage transistor of an LNA in $Z_{OPT}$, and, given this fixed parameter, other component or system parameters may be adjusted. In some implementations, in order to decrease power consumption, transistor size and/or bias point may be decreased. In some cases, smaller transistor sizes allow for a corresponding decrease in bias point.

In particular, smaller semiconductor devices, including semiconductor transistors, may have correspondingly smaller capacitances, which tend to scale with device size. This means that correspondingly larger impedance transformations may need to be performed between semiconductor devices and other components in order to maintain impedance-matching conditions, including the noise-minimization impedance condition noted above. For example, if capacitance C is decreased, in order to maintain a constant LC product then L (inductance) may be correspondingly increased. In some implementations, impedance matching may provide other benefits, e.g., flattening an amplifier gain across a frequency range.

However, typical on-chip inductors may not be able to provide the necessary high L values, or may not be able to provide the high L values for desired frequency bands. For example, on-chip inductors formed of a non-superconducting metal pattern may exhibit detrimental self-resonances when scaled to the sizes necessary to provide, for example, inductances of tens of nH for microwave-frequency signals.

Therefore, as described in this disclosure, superconducting kinetic inductors may be integrated with semiconductor devices in cryogenic circuits, in order to provide sufficiently high impedances to perform certain impedance transformations in the cryogenic circuits.

Figure 1:
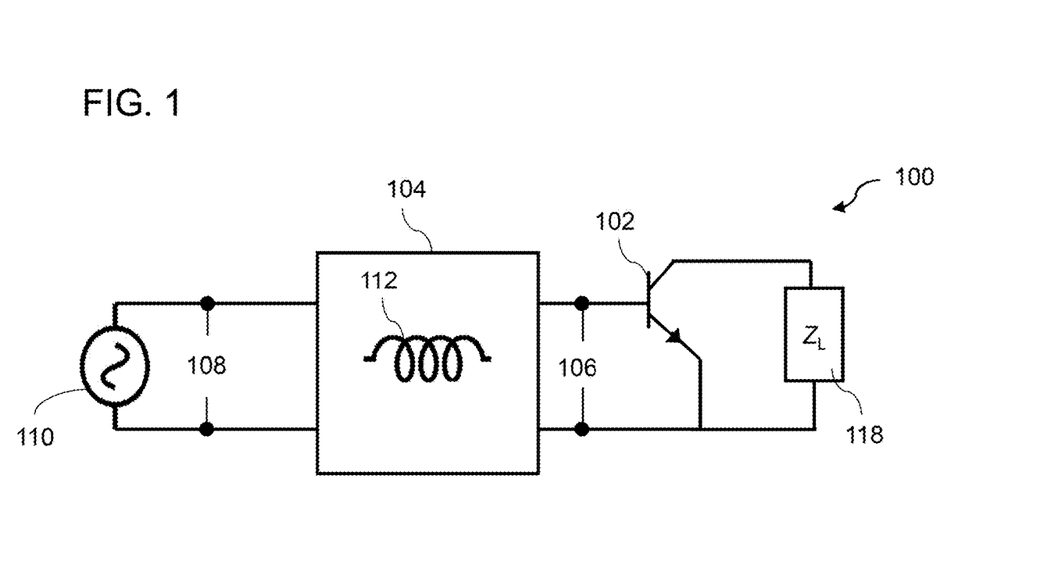
FIGS. 1 and 2 are circuit schematics showing examples of circuit devices including an impedance-matching network and a semiconductor device.

In some implementations, as shown in FIG. 1, a circuit device 100 includes a semiconductor transistor 102 and an impedance-matching network 104. The impedance-matching network 104 is configured to transform a first impedance 106 to match a predetermined second impedance 108. The first impedance 106 is an input impedance of the semiconductor transistor 102, and the second impedance 108 is an impedance of a signal generator 110.

The impedance-matching network 104 includes a kinetic inductor 112. As discussed in further detail below, the kinetic inductor 112 may be implemented as a film of superconductor material.

Figure 2:
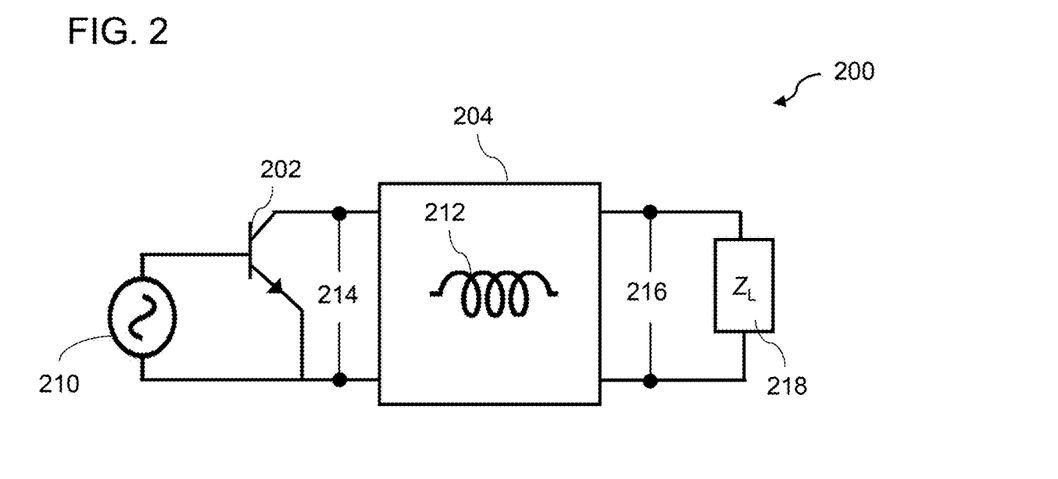

FIG. 2 shows another implementation according to this disclosure. In this example, a circuit device 200 includes a semiconductor transistor 202 and an impedance-matching network 204 including a kinetic inductor 212. The impedance-matching network 204 is configured to transform a first impedance 214 to match a predetermined second impedance 216. The first impedance 214 is an output impedance of the semiconductor transistor 202, and the second impedance 216 is a load impedance ($Z_L$) 218.

Because of the respective impedance transformations performed by the impedance-matching networks 104, 204, noise due to corresponding circuit devices 100, 200 may be reduced (e.g., to a minimum noise value), and the sizes of the corresponding semiconductor transistors 102, 202 may be scaled down in order to reduce power dissipation.

Although the examples of FIGS. 1 and 2 are shown with the respective circuit devices 100, 200 including only the corresponding impedance-matching networks 104, 204 and corresponding semiconductor transistors 102, 202, in some implementations the respective circuit devices 100, 200 may include other components, as discussed in further detail below. For example, either or both of the signal generators 110, 210 may be included in the circuit devices 100, 200. As another example, loads ($Z_L$) 118, 218 may be included in the circuit devices 100, 200, e.g., the loads ($Z_L$) 118, 218 may include stages of the amplifier circuits, in some implementations including one or more further semiconductor transistors and/or impedance-matching networks.

In addition, although the examples of FIGS. 1 and 2 are shown to include a semiconductor transistor, in some implementations a circuit device according to this disclosure may include a different type of semiconductor device besides, or in addition to, a semiconductor transistor. For example, a circuit device may include a semiconductor diode, and an impedance-matching network including a kinetic inductor may transform an input impedance or an output impedance of the semiconductor diode to match a predetermined second impedance (e.g., an impedance of another semiconductor device, or an impedance of an electrical element coupled to the circuit device).

In some implementations, passive components (e.g., capacitors and/or resistors) may be included in the circuit devices 100, 200. Besides kinetic inductors, the circuit devices 100, 200 (including the impedance-matching networks 104, 204) may include other inductor designs, e.g., meandered non-superconductor metal films buried in a chip or on a surface of a chip. In some implementations, the circuit devices 100, 200 may include further nodes, e.g., ground nodes and/or DC voltage input nodes.

Any of the implementations described in this disclosure, including the examples of FIGS. 1 and 2, may be implemented as integrated circuits. The integrated circuits may include components on multiple stacked layers and include a kinetic inductor as a film of superconductor material.

Figure 3:
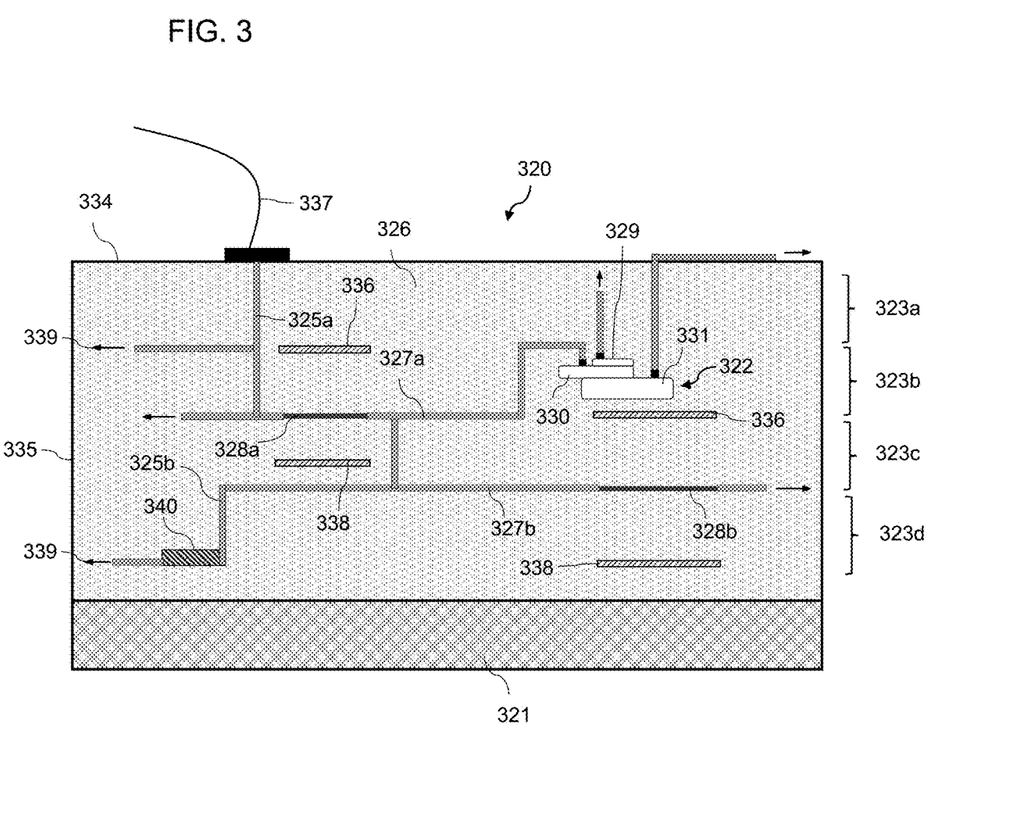
FIG. 3 is a schematic showing an example of buried circuit components integrated into a chip.

As shown in FIG. 3, a chip 320 includes a dielectric substrate 321 (e.g., single crystal silicon or sapphire) on which are formed layers 323a, 323b, 323c, 323d of an integrated circuit device. In some implementations, the chip 320 includes an amplifier circuit device and is aligned and bonded (e.g., flip-chip bonded) to a second chip that includes devices such as qubits, detectors, and/or semiconductor devices, in order to amplify signals from the second chip.

The layers 323a, 323b, 323c, 323d include various components and are separated from one another by corresponding layers of dielectric material 326. The dielectric material 326 may include, for example, silicon oxide, silicon nitride, or TEOS.

One or more of the components distributed throughout the different layers of the chip may be coupled to one another through one or more via interconnects (e.g., via interconnects 325a, 325b) formed through vias in the dielectric material 326. Other interconnects (e.g., interconnects 327a, 327b) connect components within layers of the chip. The locations of the interconnects may depend on the desired routing layout of the components of the chip.

In some implementations, the interconnects include a superconductor material, e.g., one or more of Nb, NbN, TiN, and NbTiN. In some implementations, superconducting interconnects may be configured to have lower kinetic sheet inductances than kinetic sheet inductances of kinetic inductors included in impedance-matching networks of the chip. In some implementations, the interconnects include a non-superconductor metal (e.g., copper).

The chip 320 includes a semiconductor transistor 322 in layer 323b, the semiconductor transistor 322 being, in this example, a bipolar junction transistor including an n-doped semiconductor emitter 331, a p-doped semiconductor base 330, and an n-doped semiconductor emitter 329.

The semiconductor transistor 322 is configured to operate in cryogenic temperatures compatible with superconductivity. In some implementations, the semiconductor transistor is a heterojunction bipolar junction transistor (HBT). For example, the semiconductor transistor 322 may be a SiGe HBT (e.g., a BICMOS SiGe transistor). In some implementations, a circuit may include a semiconductor field-effect transistor, e.g., a CMOS field-effect transistor or a GaAs field-effect transistor. Bipolar transistors included in circuit devices may be npn or pnp, or other doping configurations.

As described above, in some implementations a circuit may include a type of semiconductor device besides a semiconductor transistor, e.g., a semiconductor diode, and an impedance-matching network may transform an impedance of the other type of semiconductor device. A circuit may include, for example, a CMOS diode or a SiGe diode.

Note that the semiconductor transistor 322 is shown schematically in FIG. 3 as a simple example. Any of the semiconductor devices described in this disclosure may be implemented according to various designs and using a variety of different materials.

The chip 320 includes two films of superconductor material 328a, 328b in layers 323b and 323c, respectively, of the material stack. When the superconductor material is in a superconducting state, the two films 328a, 328b exhibit a kinetic inductance and operate as part of one or more impedance-matching networks. In some implementations, multiple films exhibiting a kinetic inductance and operating as part of one or more impedance-matching networks may be provided in a single layer. For example, a film of superconductor material may be deposited across an entire wafer and then patterned to form multiple individual kinetic inductors.

A superconductor (also referred to as a "superconductor material") may be understood as a material that exhibits superconducting properties at or below a superconducting critical temperature $T_C$. Accordingly, superconducting structures, such as superconducting interconnects and superconducting films, are formed from a material that exhibits superconducting properties at or below a superconducting critical temperature.

In a superconducting kinetic inductor, Cooper pairs, which also serve as charge carriers for the superconducting current, are associated with a finite inductance. This finite kinetic inductance, for certain frequencies, can be significantly larger in superconductors than in non-superconductors, at least because of the long scattering times (approaching infinite) for Cooper pairs in superconductors.

The superconductor material may include, for example, TiN, or TaN. In some implementations, the superconductor material is selected to have a critical temperature $T_C$ higher than about 10 K, which, in some implementations, may allow the circuit device to be operated at higher temperatures compared to circuit devices in which lower-$T_C$ superconductors are used, or may improve noise characteristics or power dissipation characteristics of the circuit device. Examples of superconductor materials with $T_C$ higher than about 10 K include NbN and NbTiN.

The films 328a, 328b of superconductor material, or any of the films of superconductor material providing a kinetic inductance described in this disclosure, can be characterized by a "kinetic inductance per unit square," sometimes referred to as a "kinetic inductance per square" or a "kinetic sheet inductance." The kinetic sheet inductance which depends on a thickness of the film. In some implementations, the film has a thickness between about 1 nm and about 100 nm. In some implementations, the film has a thickness between about 1 nm and about 20 nm. The kinetic inductance of the film may scale inversely with thickness, such that a thinner film may exhibit an increased kinetic sheet inductance.

The kinetic inductance per unit square of any of the superconductor films described in this disclosure may depend at least on a frequency of electrical signals passing through the superconductor film, a temperature of the superconductor film, and a magnitude of current passing through the superconductor film.

In some implementations, the kinetic inductance per unit square is between about 1 pH and about 200 pH for microwave signals, e.g., signals having a frequency between about 300 MHz and about 300 GHz.

Although the kinetic inductance per unit square may depend on the magnitude of current passing through the superconductor film, for small currents (in some implementations, for small ratios of the current to a critical current or to a depairing current of the superconductor material) the deviations from the zero-current value of kinetic inductance per square may be small. In some implementations, the kinetic inductance per unit square is between about 1 pH and about 200 pH for microwave signals when currents passing through the superconductor film have a magnitude of less than about 5% of a depairing current of the superconductor material.

The kinetic inductance per unit square also may depend on temperature, through at least the coherence length-dependence and permeability-dependence of the kinetic inductivity. For small temperatures, this temperature-dependence may be small. For example, in some implementations, the kinetic inductance per unit square is between about 1 pH and about 200 pH for microwave signals when the superconductor material is at a temperature between 0 K and about half a critical temperature of the superconductor material.

In some implementations, a total kinetic inductance of each film 328$a$, 328$b$ may be between about 1 nH and about 100 nH for microwave signals.

Although the superconductor films 328$a$, 328$b$ are shown, in the example of FIG. 3, as being in different layers of the chip 320, in some implementations, different superconductor films (acting as different kinetic inductors) may be located in the same layer of a chip. In various implementations, kinetic inductors may be provided on a surface of a chip, in a bottom layer of a chip, or in a middle layer of a chip, as shown in the example of FIG. 3.

In some implementations, a lower layer of a chip (e.g., a bottom layer of the chip) may include multiple semiconductor devices (e.g., a majority of the semiconductor devices included in the chip, or all semiconductor devices included in the chip). Other devices (e.g., metal and/or superconducting interconnects, passive devices, and kinetic inductors) may be provided in multiple layers above the multiple semiconductor devices.

As shown in FIG. 3, the superconductor films 328$a$, 328$b$ are coupled to the base 330 of the semiconductor transistor 322 via the interconnect 327$a$. As discussed below in reference to FIG. 6, this particular configuration of the kinetic inductor and the semiconductor transistor may provide advantages. In various implementations, any configuration of connections between the kinetic inductor and the semiconductor transistor (including components coupled between them) is within the scope of this disclosure.

In addition, the superconductor films 328$a$, 328$b$ are coupled, by further interconnects, to a passive circuit component 340, which is shown schematically and may include, for example, a resistor, a capacitor, or a non-superconducting inductor. Any of the passive circuit components described in this disclosure may be implemented as buried devices in a chip or on a surface of a chip. The passive components may include one or more films of material (e.g., semiconductors, metals, and/or dielectrics) and may have a variety of structures, according to known integrated circuit component design.

In the example of FIG. 3, the transistor collector 331 is coupled by another interconnect to components on a surface 334 of the chip 320. For example, components on the surface 334 may include DC power supply components, a common ground film, a superconducting ground plane, other passive or active circuit components, or ports and leads to other devices. For example, as shown in FIG. 3, a lead 337 may couple the chip 320 to a separate chip (e.g., a chip including qubits), or the lead 337 may couple to another portion of the chip 320.

In some implementations, a shielding layer (e.g., a shielding layer formed of a superconductor material) may be provided on the surface 334, in some implementations also covering sidewalls of the chip 320 (e.g., sidewall 335 of an area including multiple layers of dielectric material). The shielding layer may be configured to shield components of the chip 320 from external electromagnetic fields and/or shield other devices from electromagnetic fields generated by the chip 320. In some implementations, a shielding layer may be included in a material stack internal to the chip. In some implementations, a shielding layer may be patterned to align with other components and/or materials of the chip.

Light absorption in or interaction with the superconductor material of the kinetic inductors may have undesirable effects. For example, the light may destroy a local superconductivity of the kinetic inductors, or the light may create quasiparticles that modulate the inductance of the kinetic. Therefore, in any of the implementations described in this disclosure, a circuit device may include features configured to mitigate photodetection by superconductor films forming kinetic inductors. As one example, the circuit device may be configured such that, during operation, currents passing through the superconductor films have magnitudes below about 10% of a critical current of the superconductor material of the films. This may reduce effects of photon absorption in the superconductor films by preventing an avalanche effect upon photon absorption.

In any of the implementations described in this disclosure, the circuit device may include opaque layers to reduce photon transmission through the chip into the superconductor material. For example, as shown in FIG. 3, pairs of opaque layers 336, 338 are positioned, respectively, above and below the films 328$a$, 328$b$ of superconductor material, so as to block photons that might otherwise pass through the chip 320 into the film 328. In some implementations, the opaque layers may be composed of a metal. In some implementations, the opaque layers may be composed of a superconductor material, which may be the same superconductor material as used for the kinetic inductors or a different superconductor material. The opaque layers may have a same or similar shape as the superconductor films, so as to cover the superconductor films throughout a length of the superconductor films (e.g., along meanders of the superconductor films). In some implementations, the opaque layers may be blanket layers, e.g., the opaque layers may extend across a layer of the material stack without being patterned to align with kinetic inductors.

With the inclusion of the opaque layers, a portion of the chip includes three films stacked on top of each other (metal-superconductor-metal or superconductor-superconductor-superconductor), with dielectric material between the films. This design may be referred to as a stripline configuration of layers.

"Opaque," as used in this disclosure, refers at least to materials that block, or substantially block, the passage of light that may be absorbed by or interact significantly with the superconductor material of the kinetic inductors. For example, opaque films may prevent light transmission for light between the infrared range and the terahertz range.

FIG. 3 shows only a simple example schematic of several components included in a chip 320. As indicated by the arrows (e.g., arrows 339), in any of the implementations described in this disclosure, the example components shown in FIG. 3 may be further coupled to other components not shown in FIG. 3, which may include, for example, further semiconductor transistors or other semiconductor devices, further superconductor films having a kinetic inductance, and further passive components. Chips may include inputs and outputs (e.g., coupling ports) for receiving and sending signals. Chips may include power provision components for distribution operation voltages (e.g., DC voltages) to buried components. Components may be distributed throughout the chip in depth (e.g., in multiple buried layers) and/or in both lateral dimensions.

Figure 6:
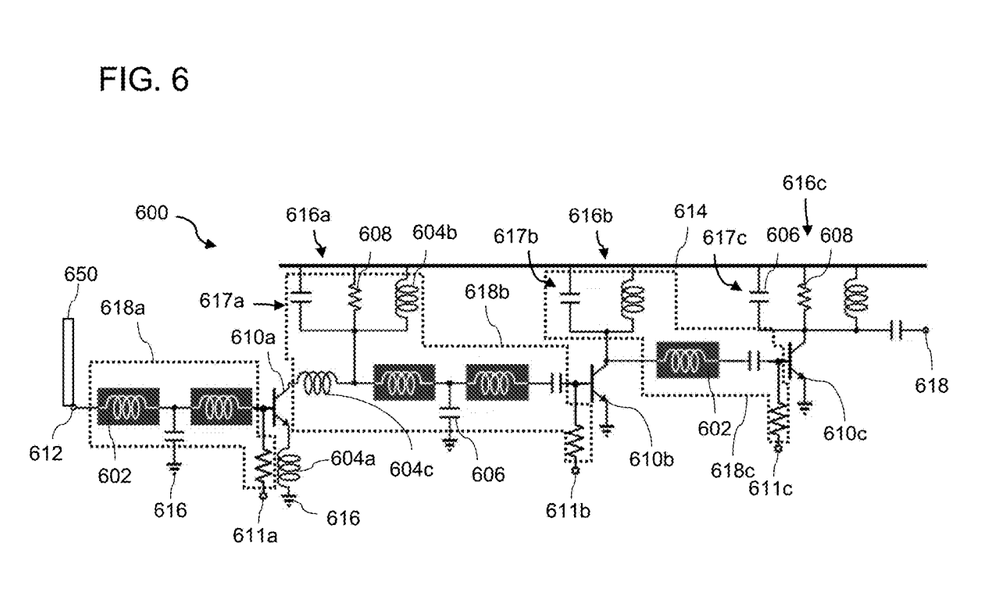
FIG. 6 is a circuit schematic showing an example of a circuit device including an impedance-matching network and a semiconductor device.

In addition, the specific arrangement of components shown in FIG. 3 is merely exemplary. Circuit devices including at least a semiconductor transistor and a superconducting kinetic inductor may be configured to have many different arrangements of components and couplings between components. An example circuit for an amplifier is shown in FIG. 6.

In some implementation, the integration of the semiconductor transistor and the kinetic inductor in a chip provides advantages over cases in which, for example, the two components are positioned in separate chips or substrates. A chip-to-chip coupling may have a high parasitic capacitance (e.g., because of wires or cables between the chips, or because of a comparatively long distance between the chips compared to intra-chip connections), which may introduce increased signal loss or noise. A higher capacitance may also limit bandwidth for signal transmission. Because the semiconductor transistor and the kinetic inductor are integrated into the same chip, the parasitic capacitance is reduced, and losses and/or signal noise may be reduced.

As described in this disclosure, superconducting kinetic inductors are integrated together with semiconductor transistors in an integrated circuit in a chip. In order to fabricate the integrated circuit, superconductor material deposition and fabrication may be integrated together with semiconductor, dielectric, and metal material deposition and fabrication, such that the superconductor material of the kinetic inductors is distributed in one or more layers of a stack that also includes non-superconductor interconnects, contacts, dielectric layers, passive components, and active (e.g., semiconductor device) components.

FIGS. 4A-4F show examples of fabrication methods to integrate a superconducting kinetic inductor and a semiconductor transistor in a single chip.

Figure 4A:
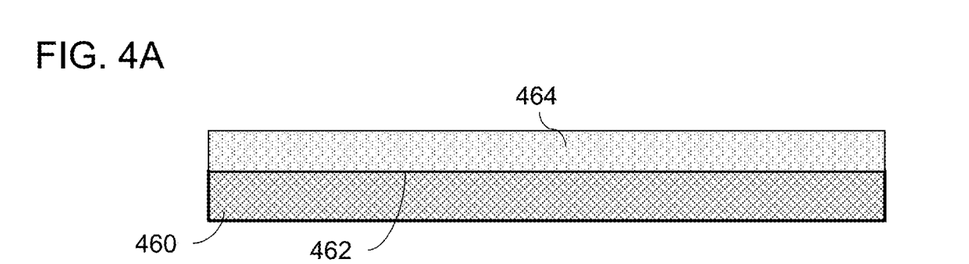
FIGS. 4A-4F are schematics showing examples of process steps for fabricating a circuit device including an impedance-matching network and a semiconductor device.

As shown in FIG. 4A, on a surface 462 of a dielectric substrate 460, a dielectric layer 464 is deposited. The dielectric layer 464 may be deposited by a variety of methods, including, for example, physical vapor deposition (e.g., evaporation or sputtering), chemical vapor deposition, or atomic layer deposition.

Figure 4B:
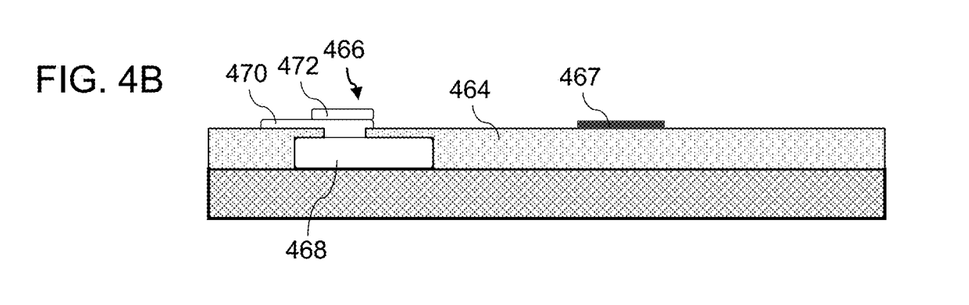

As shown in FIG. 4B, a series of processing steps are performed to fabricate a SiGe heterojunction bipolar transistor 466 in the dielectric layer 464. These steps may include high-temperature anneals, etches (e.g., wet etches or dry etches such as plasma etches), lift-off, physical masking, photolithography and/or electron-beam lithography, material deposition methods including physical vapor deposition, chemical vapor deposition, atomic layer deposition, epitaxial growth (e.g., molecular beam epitaxy), polishing (e.g., chemical, mechanical, and/or chemical-mechanical polishing), and doping using, for example, ion-beam implantation, among other possible fabrication methods.

The fabricated transistor 466 includes a collector 468, a base 470, and an emitter 472. As described above, the transistor 466 is shown schematically. As practically implemented, any of the semiconductor transistors described in this disclosure may include a variety of device structures and materials, including highly-doped poly-Si regions, internal oxide and/or nitride regions, buried SiGe regions (e.g., buried SiGe bases), and silicide contact regions. Semiconductor transistor processing may include shallow and deep trench isolation.

In some implementations, a semiconductor transistor as included in this disclosure may have lateral dimensions between about 10 nm and about 10 μm.

As also shown in FIG. 4B, before, during, or after the fabrication of the transistor 466, a first film of superconductor material 467 is provided, using a deposition technique as described above. The first film 467 shown in FIG. 4B may be patterned, e.g., a blanket layer of superconductor material may be deposited, selectively masked, and etched, to produce the spatially-limited first film 467.

Figure 4C:
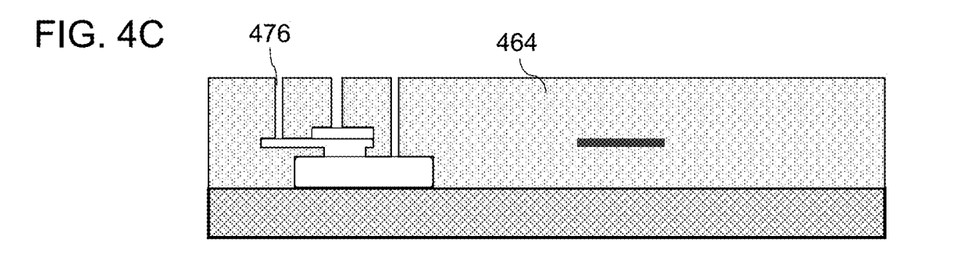

As shown in FIG. 4C, further dielectric material 464 is provided, and vias 476 are formed in the dielectric material 464. These vias 476 may be formed using one or more of the fabrication techniques described above.

Figure 4D:
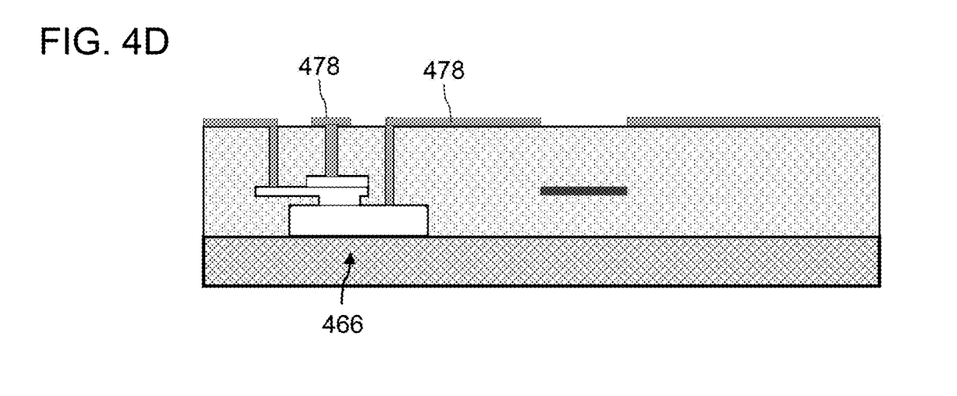

As shown in FIG. 4D, interconnects 478 are provided and patterned to contact portions of the transistor 466 and to couple the transistor 466 to other portions of the circuit (not shown). The interconnects may be configured to couple components between layers or to couple components laterally within a layer.

Figure 4E:
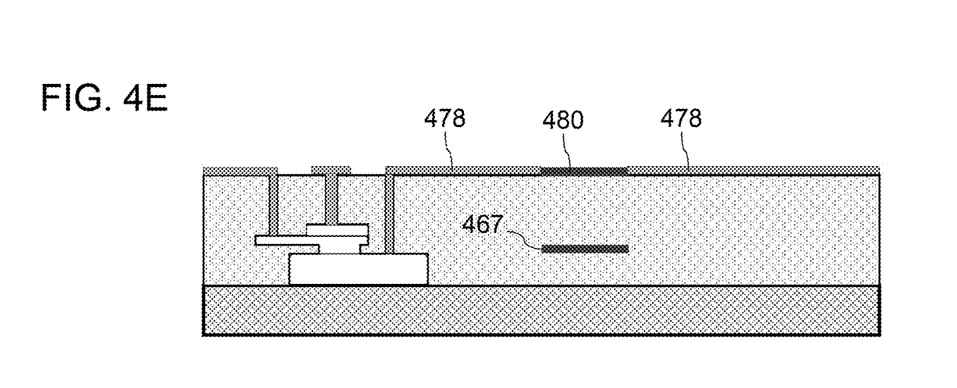

As shown in FIG. 4E, a second superconductor film 480 is provided directly above the first superconductor film 467. The second superconductor film 480 is configured to connect to interconnects 478. The second superconductor film 480 may serve as a kinetic inductor, e.g., the superconductor film 480 may be part of an impedance-matching network configured to transform an output impedance of the transistor 466 to match a particular value.

Figure 4F:
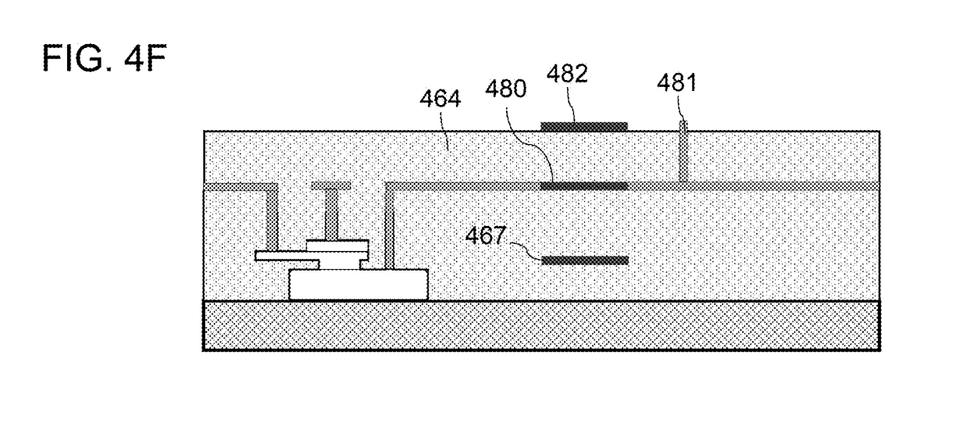

As shown in FIG. 4F, further dielectric material 464 is provided, an additional interconnect 481 is provided in a via through the dielectric material 464 (e.g., to couple the second superconductor film 480 to another component, not shown), and a third superconductor film 482 is provided, aligned laterally with the first and second superconductor films 467, 480. In this stripline configuration, the first and third superconductor films 467, 482 may act as opaque layers to reduce photon transmission into the second superconductor film 480, which exhibits kinetic induction and is coupled into a circuit. The first and third superconductor films 467, 482 may be, but need not be, coupled to the circuit. In some implementations, the first and third superconductor films 467, 482 may be wider than the second superconductor film 480 serving as a kinetic inductor, in order to more effectively block light.

When superconducting kinetic inductors are integrated into a chip, the kinetic inductors may heat up during device operation, e.g., through leads between the kinetic inductors and other components. The heating may cause a loss of superconductivity or a modulation of kinetic inductivity properties. For at least this reason, relatively high-TC superconductor material may be used, as described above.

In some implementations, in order to mitigate superconductor heating, the kinetic inductors may be separated from active circuit components (e.g., semiconductor transistors) and/or from circuit components that dissipate significant heat (e.g., passive circuit components carrying significant DC current). In some implementations, kinetic inductors may be separated from active circuit components by between about 10 μm and about 1 mm. In some implementations, in order to mitigate superconductor heating, non-superconductor metals may be used to conduct heat away from the kinetic inductors.

Figure 5:
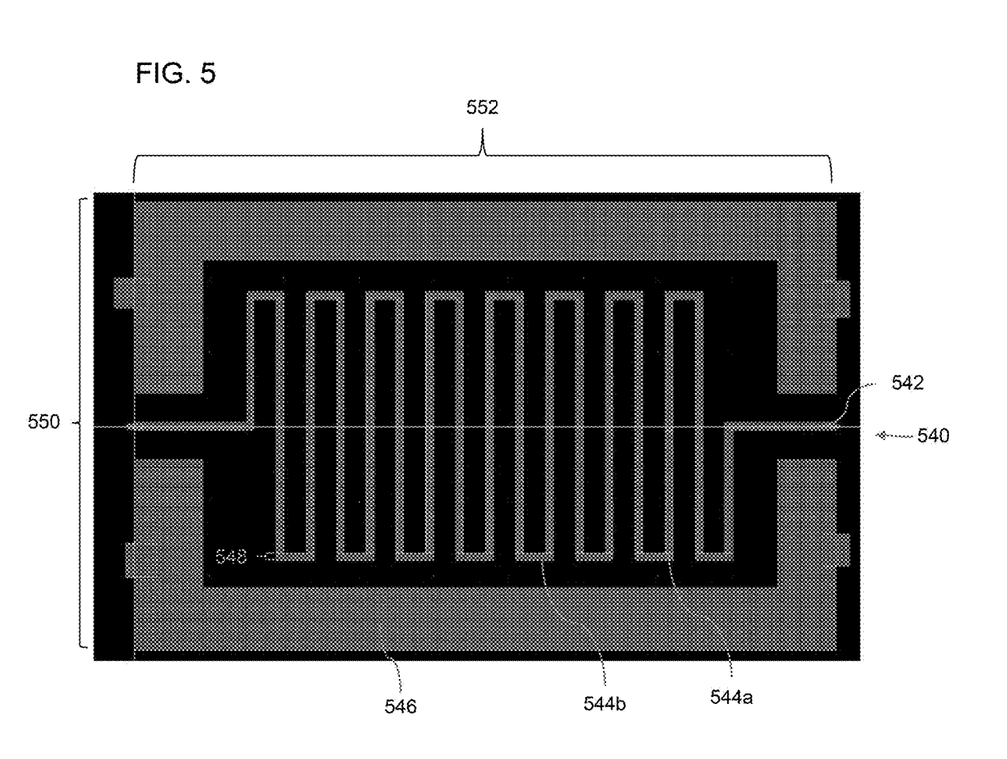
FIG. 5 is a top view of an example of a kinetic inductor.

As described in reference to FIGS. 3 and 4A-4F, in some implementations a kinetic inductor is implemented as a film of superconductor material. FIG. 5 shows a top view of an example film of superconductor material configured to form a kinetic inductor. In this example, a kinetic inductor 540 includes a film 542 of superconductor material arranged in a series of meanders (e.g., meanders 544a, 544b). The meanders may increase a length of the film able to fit into a given area, thereby increasing the film's kinetic inductivity (which is, neglecting self-resonance and other non-ideal effects, proportional to film length). In some implementations, a film of superconductor material used as a kinetic inductor may include between 2 and 100 meanders. "Length," as used in this disclosure, may be measured in directions parallel to local current flow.

In some cases, self-resonance may occur when a length of the film of superconductor material is comparable to a wavelength of signals passing through the film during operation of a circuit device including a kinetic inductor formed by the film. Self-resonance may decrease an inductance of the kinetic inductor. Therefore, in any of the implementations described in this disclosure, the film of the superconductor material may be configured to have a length that is less than about 10% of the wavelengths of microwave signals transmitted through the film when the film is in a superconducting state. In any of the implementations described in this disclosure, the film of the superconductor material may be configured to have a length between about 1 μm and about 200 μm.

In any of the implementations described in this disclosure, the film of superconductor material may have a width (e.g., a width 548 in FIG. 5) between about 10 nm and about 200 nm. The kinetic inductance of the film may scale inversely with width, such that a narrower film may exhibit an increased kinetic inductance.

In any of the implementations described in this disclosure, an externally-measured length or externally-measured width of a kinetic inductor may be between about 1 μm and about 50 μm. For example, the dimensions 550, 552 in FIG. 5 may be between about 1 μm and about 50 μm.

In some implementations, kinetic inductors may include or be integrated together with elements besides a film of superconductor material. Such elements may couple the kinetic inductor to other portions of a circuit device, or may enhance electronic characteristics of the kinetic inductor. In the example of FIG. 5, a ground ring 546 is disposed around a periphery of the film 542 of superconductor material. The ground ring 546 may define ground return paths for current. In various implementations, a ground ring may include superconductor material and/or non-superconductor material. In some implementations, a ground ring may be on a different layer from a corresponding kinetic inductor, e.g., a shielding layer in a stripline configuration may provide a ground return path.

FIG. 6 shows an example of a circuit device according to one possible implementation of the current disclosure. While FIG. 6 illustrates several design features that may be included in implementations according to the current disclosure, it is merely exemplary, and many other circuit designs are also within the scope of this disclosure.

As shown in FIG. 6, an amplifier circuit 600, designed for operation at cryogenic temperatures, includes a plurality of superconducting kinetic inductors (e.g., kinetic inductors 602), indicated by the shaded inductor symbols. The amplifier 600 also includes: a plurality of non-kinetic inductors (e.g., non-kinetic inductors 604a, 604b, 604c), which in some implementations may be composed of non-superconductor metals; a plurality of capacitors (e.g., capacitors 606); a plurality of resistors 608; and a plurality of semiconductor transistors 610a, 610b, 610c.

As described above, any or all of these components may be integrated together as an integrated circuit in a single chip, which may provide operational advantages. In some implementations, one or more of the components may be positioned in or on a second chip and coupled to the other components of the amplifier circuit 600. For example, in some implementations, the superconducting kinetic inductors may be fabricated in or on a first chip, the semiconductor transistors may be fabricated in or on a second chip, and the two chips may be bonded together (e.g., flip-chip bump-bonded).

The amplifier circuit 600 also includes an input port 612, a DC voltage rail 614, a plurality of ground nodes (e.g., ground nodes 616), and an output port 618.

A wide range of component parameters are within the scope of this disclosure. In some implementations, the supply voltage at the rail 614 may be between about 10 mV and about 1 V. In some implementations, each kinetic inductor may have an inductance between about 1 nH and about 100 nH. In some implementations, each non-kinetic inductor may have an inductance between about 0.1 nH and about 10 nH. In some implementations, each capacitor may have a capacitance between about 10 fF and about 20 pF. In some implementations, each capacitor may have a capacitance between about 10 fF and about 100 pF. In some implementations, each resistor 608 may have a resistance between about 1 Ohm and 500 MOhm.

In some implementations, the amplifier circuit 600 may be configured to amplify signals having frequencies between about 1 GHz and about 10 GHz. In some implementations, the amplifier circuit may be configured to amplify signals having microwave frequencies.

In some implementations, a DC power dissipation of the amplifier circuit may be between about 10 μW and 500 μW.

Other circuit device implementations may have different parameter values. For example, if sizes of the semiconductor transistors are reduced, the supply current (e.g., collector current) may be reduced, and the inductances of the kinetic inductors may correspondingly rise (by a modification of the design of the kinetic inductors) in order to maintain impedance-matching. The reduction in transistor size and/or reduction in supply current may also reduce a DC power dissipation of the circuit device.

The amplifier device 600 includes three amplifying stages 616a, 616b, 616c and three impedance-matching networks 618a, 618b, 618c. Each amplifying stage 616a, 616b, 616c includes a respective LC or RLC network 617a, 617b, 617c between the supply voltage rail 614 and the amplifying transistors 610a, 610, 610c. The LC or RLC networks may operate as part of respective impedance-matching networks. Each transistor 610a, 610b, 610c is biased at a respective DC bias port 611a, 611b, 611c at a base of the transistor. In various implementations, a number of stages and/or a number of impedance-matching networks may be more than three or fewer than three.

The first impedance-matching network 618a, in conjunction with the first emitter inductance 604a, is configured to transform an input impedance of the semiconductor transistor 610a to match an impedance presented at the input port 612. The impedance presented at the input port 612 may be, for example, an output impedance of a signal generator or signal carrier component. For example, in some implementations, the impedance presented at the input port 612 may be an output impedance of a coaxial cable 650. In some implementations, an impedance matched using an impedance-matching network may be about 50 Ohms.

The impedance presented at the input port 612 is not, in some implementations, an arbitrary value. Rather, as described above, the transistor 610a may be designed (e.g., through a choice of a size of the transistor 610a) such that the impedance presented at the input port 612 is $Z_{OPT}$, the impedance that minimizes noise for signals amplified by the transistor 610a. In any of the implementations described in this disclosure, an impedance-matching network 618a may be configured to transform a first impedance to match a second impedance that minimizes a noise of a circuit device.

The second impedance-matching network 618b is configured to transform an output impedance of the transistor 610a to match an input impedance of the transistor 610b. In some implementations, this matching may reduce a noise of the amplifier device 600, as described above. In some implementations, the second impedance-matching network 618b (which may be termed an "internal" impedance-matching network, because the second impedance-matching network 618b matches impedances between components of the amplifier circuit 600) may flatten a gain of the amplifier circuit 600 across a frequency range by reducing impedance mismatch between the transistors 610a and 610b.

The second impedance-matching network 618b includes two kinetic inductors 602. In various implementations, an impedance-matching network may include one, two, or more than two kinetic inductors. The second impedance-matching network 618b also includes the passive components of the RLC network 617a, two other capacitors, another resistor (coupled to the DC bias port 611b), and another non-kinetic inductor.

The third impedance-matching network 618c is configured to transform an output impedance of the transistor 610b to match an input impedance of the transistor 610c, performing the functions described for the second impedance-matching network 618b. The third impedance-matching network, besides a kinetic inductor, also includes two capacitors, a non-kinetic inductor, and a resistor.

Because of the relatively high impedance values of kinetic inductors (as compared to other on-chip inductor types), the impedance-matching networks 618a, 618b, 618c are able to perform larger impedance transformations than if another inductor type were used instead. The kinetic inductors are configured (e.g., based on at least one of a selection of superconductor material and geometric parameters of the superconductor films of the kinetic inductors) to transform the impedances in order to satisfy impedance-matching conditions that may improve circuit performance.

As shown in FIG. 6, each impedance-matching network includes a capacitor coupled to a kinetic inductor. In some implementations, a capacitor may be coupled directly to a transistor base and to a kinetic inductor, as shown for capacitors in the second and third stages 616b, 616c. In any of the implementations described in this disclosure, capacitors in impedance-matching networks may be configured to have capacitances that contribute towards impedance-matching, e.g., capacitances C that maintain an LC product, where L is the inductance of one or more kinetic inductors also in the impedance-matching network.

In the amplifier circuit 600, and in any of the implementations described in this disclosure, kinetic inductors may be positioned in the circuit device such that significant current does not pass through the kinetic inductors. This design feature may provide several advantages. First, this design feature may decrease an amount of heat transferred to the kinetic inductors (and therefore maintain superconductivity and/or maintain constant inductivity characteristics) by reducing a number of significantly power-dissipating components coupled to the kinetic inductors. In addition, this design feature may reduce possible negative effects of high current passing through the kinetic inductors, e.g., loss of superconductivity and/or changes in inductance characteristics.

The amount of current passing through each kinetic inductor in a circuit device, according to this disclosure, depends on the particular implementation. In some implementations, kinetic inductors are incorporated into current paths with current flows of between about 0 µA and about 1 µA. Sub-microamp current flow may allow the kinetic inductors to behave more linearly and/or more predictably.

In order to maintain small currents passing through the kinetic inductors, in any of the implementations described in this disclosure, superconducting kinetic inductors in circuit devices may be positioned on current paths that do not carry significant DC current. For example, all kinetic inductors in the amplifier circuit 600 of FIG. 6 are positioned on current paths that draw between about 0 nA and 100 nA of current. In some implementations, kinetic inductors may be positioned on a current path leading to a base or a gate of a semiconductor transistor, which may not draw significant current. Other circuit configurations may also be used in order to maintain small current values through the kinetic inductors.

Figure 7:
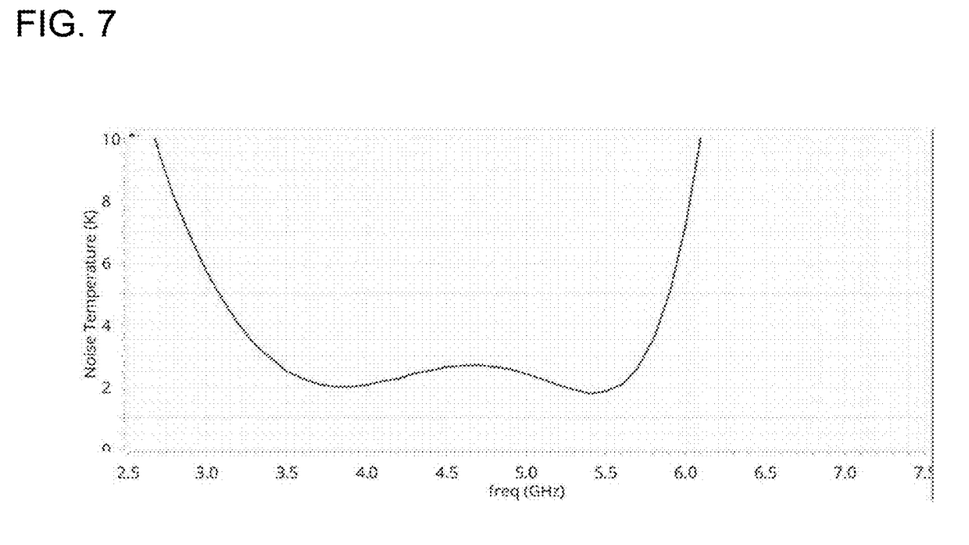
FIG. 7 shows an example simulated noise curve for an example circuit device.

In some implementations, a cryogenic amplifier circuit including a semiconductor transistor and an impedance-matching network including a superconducting kinetic inductor may have a gain between about 10 dB and about 60 dB for signals having microwave frequencies, e.g., for signals having frequencies between about 1 GHz and about 10 GHz. A noise temperature of the amplifier circuit may be maintained between about 0.5 K and about 5 K over a frequency range over which the amplifier circuit is configured to function, e.g., for signals having microwave frequencies or for signals having frequencies between about 1 GHz and about 10 GHz. FIG. 7 shows an example of simulated noise temperature for one example of an amplifier circuit as shown in FIG. 6. In FIG. 7, the horizontal axis is frequency in GHz, and the vertical axis is noise temperature in K (Kelvin). As shown in FIG. 7, the noise temperature is maintained at between 0.5 K and 5 K over a frequency range of about 3.1 GHz to about 5.9 GHZ.

As previously described, although FIG. 6 shows a circuit device include bipolar junction transistors, in some implementations field-effect transistors (e.g., MOSFETs) may be used instead of or in addition to bipolar junction transistors.

When a field-effect transistor is used, references in this disclosure to "bases" of the transistors may apply to the gate of the field-effect transistor. In such implementations, the depictions of bipolar junction transistors in FIG. 6 can represent field-effect transistors.

Although this disclosure sometimes refers to amplifier circuit devices, in some implementations the circuit devices described in this disclosure can be used for other circuit applications, e.g., filtering or other signal processing methods.

In some implementations, a circuit device as described in this disclosure may be coupled to a quantum computing device, e.g., a qubit. For example, a transmission line (e.g., a superconducting transmission line integrated into the same chip as the circuit device) may carry a readout signal from a qubit as an input to an amplifier circuit that includes a semiconductor transistor and an impedance-matching network including a kinetic inductor. The amplifier circuit may amplify the readout signal and output the readout signal to other (e.g., non-cryogenic) electronics.

In some implementations, the circuit devices described in this disclosure may provide control signals for quantum circuit components (e.g., qubits and qubit couplers). The control signals may be provided in digital and/or analog form.

"Cryogenic," as used in this disclosure, refers at least to temperatures at which superconductor materials (e.g., the superconductor materials described in this disclosure and/or integrated into circuit devices described in this disclosure) become superconducting under atmospheric or near-atmospheric pressures.

While this specification contains many specific implementation details, these should not be construed as limitations on the scope of what may be claimed, but rather as descriptions of features that may be specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination.

Moreover, although features may be described above as acting in certain combinations and even initially claimed as such, one or more features from a claimed combination may in some cases be excised from the combination, and the claimed combination may be directed to a sub-combination or variation of a sub-combination.

Particular embodiments of the subject matter have been described. Other embodiments are within the scope of the following claims. For example, the actions recited in the claims may be performed in a different order and still achieve desirable results. As one example, the processes depicted in the accompanying figures do not necessarily require the particular order shown, or sequential order, to achieve desirable results.

What is claimed is:

1. A circuit device comprising:
   a semiconductor device, and
   an impedance matching network, wherein the impedance matching network comprises a film of superconductor material forming at least one inductor of the circuit device, wherein the film of the superconductor material exhibits a kinetic sheet inductance between 1 pH and 200 pH for microwave signals when in a superconducting state, and
   wherein the impedance matching network is configured to transform an impedance of the semiconductor device to match a predetermined second impedance during operation of the circuit device.

2. The circuit device of claim 1, wherein the circuit device is an amplifier.

3. The circuit device of claim 1, wherein the semiconductor device is a semiconductor transistor.

4. The circuit device of claim 3, wherein the transformed impedance of the semiconductor device is an output impedance of the semiconductor transistor, such that the impedance matching network is configured to transform the output impedance of the semiconductor transistor to match the predetermined second impedance.

5. The circuit device of claim 4, comprising a second semiconductor transistor, wherein the predetermined second impedance is an input impedance of the second semiconductor transistor.

6. The circuit device of claim 3, wherein the semiconductor transistor is a heterojunction bipolar transistor or a field-effect transistor.

7. The circuit device of claim 1, wherein the predetermined second impedance is an impedance that reduces a noise of the circuit device.

8. The circuit device of claim 1, wherein the predetermined second impedance is an impedance of an electrical element coupled to the circuit device.

9. The circuit device of claim 8, wherein the electrical element comprises a coaxial cable.

10. The circuit device of claim 1, wherein the predetermined second impedance is about 50 Ohms.

11. The circuit device of claim 1, wherein the semiconductor device and the at least one inductor are formed as part of an integrated circuit integrated in a single chip.

12. The circuit device of claim 11, wherein the single chip comprises a plurality of metal layers buried at respective heights in a dielectric material,
    at least a first of the plurality of metal layers including a contact trace coupled to the semiconductor device,
    at least a second of the plurality of metal layers including the film of the superconductor material.

13. The circuit device of claim 11, wherein the single chip comprises a first layer above the film of the superconductor material and a second layer below the film of the superconductor material,
    wherein the first layer and the second layer comprise an opaque material.

14. The circuit device of claim 13, wherein the first layer and the second layer comprise a second superconductor material.

15. The circuit device of claim 1, wherein the impedance matching network comprises a capacitor coupled to the at least one inductor.

16. The circuit device of claim 15, wherein the semiconductor device is a semiconductor transistor, and wherein the capacitor is coupled to a base of the semiconductor transistor.

17. The circuit device of claim 1, wherein the circuit device is coupled to a qubit.

18. The circuit device of claim 1, wherein the kinetic sheet inductance between 1 pH and 200 pH is effective when currents passing through the at least one inductor have a magnitude of less than about 5% of a depairing current of the film of the superconductor material.

19. The circuit device of claim 1, wherein the kinetic sheet inductance between 1 pH and 200 pH is effective when the film of the superconductor material is at a temperature between 0 K and about half a critical temperature of the film of the superconductor material.

20. The circuit device of claim 1, wherein a total kinetic inductance of the at least one inductor is between about 1 nH and about 100 nH for microwave signals.

21. The circuit device of claim 1, wherein the at least one inductor has a dimension between about 1 µm and about 50 µm.

22. The circuit device of claim 1, wherein the film of the superconductor material has a meandering shape, the meandering shape having between two and fifty meanders.

23. A circuit device comprising:
a semiconductor device, and
an impedance matching network, wherein the impedance matching network comprises a superconductor material forming at least one inductor of the circuit device, wherein the superconductor material exhibits a kinetic sheet inductance when in a superconducting state,
wherein a total kinetic inductance of the at least one inductor is between 1 nH and 100 nH for microwave signals, and
wherein the impedance matching network is configured to transform an impedance of the semiconductor device to match a predetermined second impedance during operation of the circuit device.

24. The circuit device of claim 23, wherein a kinetic inductance of each of the at least one inductor is between 1 nH and 100 nH for microwave signals.

25. The circuit device of claim 23, wherein the at least one inductor has a dimension between about 1 µm and about 50 µm.

26. A circuit device comprising:
a semiconductor transistor, and
an impedance matching network, wherein the impedance matching network comprises a superconductor material forming at least one inductor of the circuit device, wherein the superconductor material exhibits a kinetic sheet inductance when in a superconducting state, and
wherein the impedance matching network is configured to transform an impedance of the semiconductor transistor to match a predetermined second impedance during operation of the circuit device.

27. The circuit device of claim 26, wherein the transformed impedance is an output impedance of the semiconductor transistor, such that the impedance matching network is configured to transform the output impedance of the semiconductor transistor to match the predetermined second impedance.

28. The circuit device of claim 27, comprising a second semiconductor transistor, wherein the predetermined second impedance is an input impedance of the second semiconductor transistor.

29. The circuit device of claim 26, wherein the semiconductor transistor is a heterojunction bipolar transistor or a field-effect transistor.

30. A circuit device comprising:
a semiconductor device, and
an impedance matching network, wherein the impedance matching network comprises a film of superconductor material forming at least one inductor of the circuit device, wherein the film of the superconductor material exhibits a kinetic sheet inductance when in a superconducting state,
wherein the impedance matching network is configured to transform an impedance of the semiconductor device to match a predetermined second impedance during operation of the circuit device, and
wherein the semiconductor device and the at least one inductor are formed as part of an integrated circuit integrated in a single chip,
wherein the single chip comprises a plurality of metal layers buried at respective heights in a dielectric material,
at least a first of the plurality of metal layers including a contact trace coupled to the semiconductor device, and
at least a second of the plurality of metal layers including the film of the superconductor material.

31. The circuit device of claim 30, wherein the single chip comprises a first layer above the film of the superconductor material and a second layer below the film of the superconductor material,
wherein the first layer and the second layer comprise an opaque material.

32. The circuit device of claim 30, wherein the first layer and the second layer comprise a second superconductor material.

33. A cryogenic amplifier circuit comprising:
a plurality of semiconductor transistors; and
an impedance matching network coupled to a first semiconductor transistor of the plurality of semiconductor transistors, the impedance matching network comprising at least one kinetic inductor comprising a superconductor material,
wherein the superconductor material exhibits a kinetic sheet inductance when in a superconducting state, and
wherein an impedance of the cryogenic amplifier circuit matches a predetermined second impedance.

34. The cryogenic amplifier circuit of claim 33, wherein the impedance matching network comprises a capacitor coupled to the at least one kinetic inductor and to a base of the first semiconductor transistor, and wherein the cryogenic amplifier circuit comprises:
an LC network or RLC network coupled to a collector of the first semiconductor transistor; and
a ground node coupled to an emitter of the first semiconductor transistor.

* * * * *

UNITED STATES PATENT AND TRADEMARK OFFICE
CERTIFICATE OF CORRECTION

| | | |
|---|---|---|
| PATENT NO. | : 12,155,363 B2 | |
| APPLICATION NO. | : 17/381174 | |
| DATED | : November 26, 2024 | |
| INVENTOR(S) | : Joseph Cheney Bardin | |

It is certified that error appears in the above-identified patent and that said Letters Patent is hereby corrected as shown below:

In the Claims

Column 18, Line 30, Claim 32, delete "The circuit device of claim 30" and insert --The circuit device of claim 31--.

Signed and Sealed this
Twenty-fifth Day of March, 2025

Coke Morgan Stewart
*Acting Director of the United States Patent and Trademark Office*